T

United States Patent
Huang et al.

(10) Patent No.: US 9,041,022 B2
(45) Date of Patent: May 26, 2015

(54) LIGHT EMITTING DIODE PACKAGE AND METHOD FOR MANUFACTURING THE SAME

(71) Applicant: ADVANCED OPTOELECTRONIC TECHNOLOGY, INC., Hsinchu Hsien (TW)

(72) Inventors: Che-Hsang Huang, Hsinchu (TW); Pin-Chuan Chen, Hsinchu (TW); Lung-Hsin Chen, Hsinchu (TW); Wen-Liang Tseng, Hsinchu (TW); Yu-Liang Huang, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/011,682

(22) Filed: Aug. 27, 2013

(65) Prior Publication Data

US 2014/0084313 A1 Mar. 27, 2014

(30) Foreign Application Priority Data

Sep. 21, 2012 (CN) .......................... 2012 1 0353745 7

(51) Int. Cl.
*H01L 33/36* (2010.01)
*H01L 25/075* (2006.01)
*H01L 23/00* (2006.01)
*H01L 33/62* (2010.01)

(52) U.S. Cl.
CPC ............ *H01L 33/36* (2013.01); *H01L 25/0753* (2013.01); *H01L 33/62* (2013.01); *H01L 24/97* (2013.01); *H01L 2224/48091* (2013.01); *H01L 2224/48247* (2013.01); *H01L 2224/48257* (2013.01); *H01L 2924/12041* (2013.01)

(58) Field of Classification Search
CPC ..... H01L 25/0753; H01L 24/97; H01L 33/36; H01L 33/62; H01L 33/486
USPC ................ 257/79, 88, 98, 670, 671, 678, 723
See application file for complete search history.

(56) References Cited

U.S. PATENT DOCUMENTS

2012/0080674 A1 4/2012 Shimizu et al.
2014/0084315 A1* 3/2014 Huang et al. .................... 257/91

FOREIGN PATENT DOCUMENTS

| JP | 2000294832 A | 10/2000 |
| JP | 2011176256 A | 9/2011 |
| KR | 10-2011-0050285 | 5/2011 |

* cited by examiner

*Primary Examiner* — Colleen A Matthews
*Assistant Examiner* — Quovaunda V Jefferson
(74) *Attorney, Agent, or Firm* — Novak Druce Connolly Bove + Quigg LLP (57) ABSTRACT

An exemplary light-emitting diode (LED) package includes an electrically insulating substrate, an electrode structure embedded in the insulating substrate, and a plurality of LED chips electrically connecting with electrodes of the electrode structure respectively. The electrode structure includes a first electrode, a second electrode and a third electrode located between the first and second electrodes. Top surfaces of the first, second and third electrodes are exposed out of a top surface of the insulating substrate to support the LED chips. Front side and rear side faces of the first and second electrodes are exposed out of a front side face and a rear side face of the substrate whereby the front or rear side faces of the first and second electrodes can connect with welding pads of a printed circuit board. Circumferential side faces of the third electrode are encapsulated in the substrate.

12 Claims, 9 Drawing Sheets

LIGHT EMITTING DIODE PACKAGE AND METHOD FOR MANUFACTURING THE SAME

BACKGROUND

1. Technical Field

The present disclosure generally relates to solid state light emitting sources and, more particularly, to a light emitting diode (LED) package and a method for manufacturing the LED package.

2. Description of Related Art

LEDs have many advantages, such as high luminosity, low operational voltage, low power consumption, compatibility with integrated circuits, easy driving, long term reliability, and environmental friendliness which have promoted the wide use of LEDs as a light source.

A conventional LED package includes a substrate, a plurality of electrodes arranged on the substrate, a plurality of LED chips mounted on the electrodes and electrically connecting with the electrodes respectively. When the LED package is mounted to a printed circuit board, every electrode of the LED package is exposed to electrically connect a corresponding welding pad on the printed circuit board. Because a distance between two adjacent electrodes is very close, such that, welding solder on the welding pads of the printed circuit board can easily overflow from one electrode to the adjacent electrode to contaminate the electrodes during the SMT (surface mounting technology) process, thereby resulting in a short circuit of the LED package.

Therefore, what is needed, is an LED package and a method for manufacturing the LED package which can overcome the limitations described above.

DETAILED DESCRIPTION

Embodiments of the LED package and a method for manufacturing the LED package of the present disclosure will now be described in detail below and with reference to the drawings.

Figure 1:
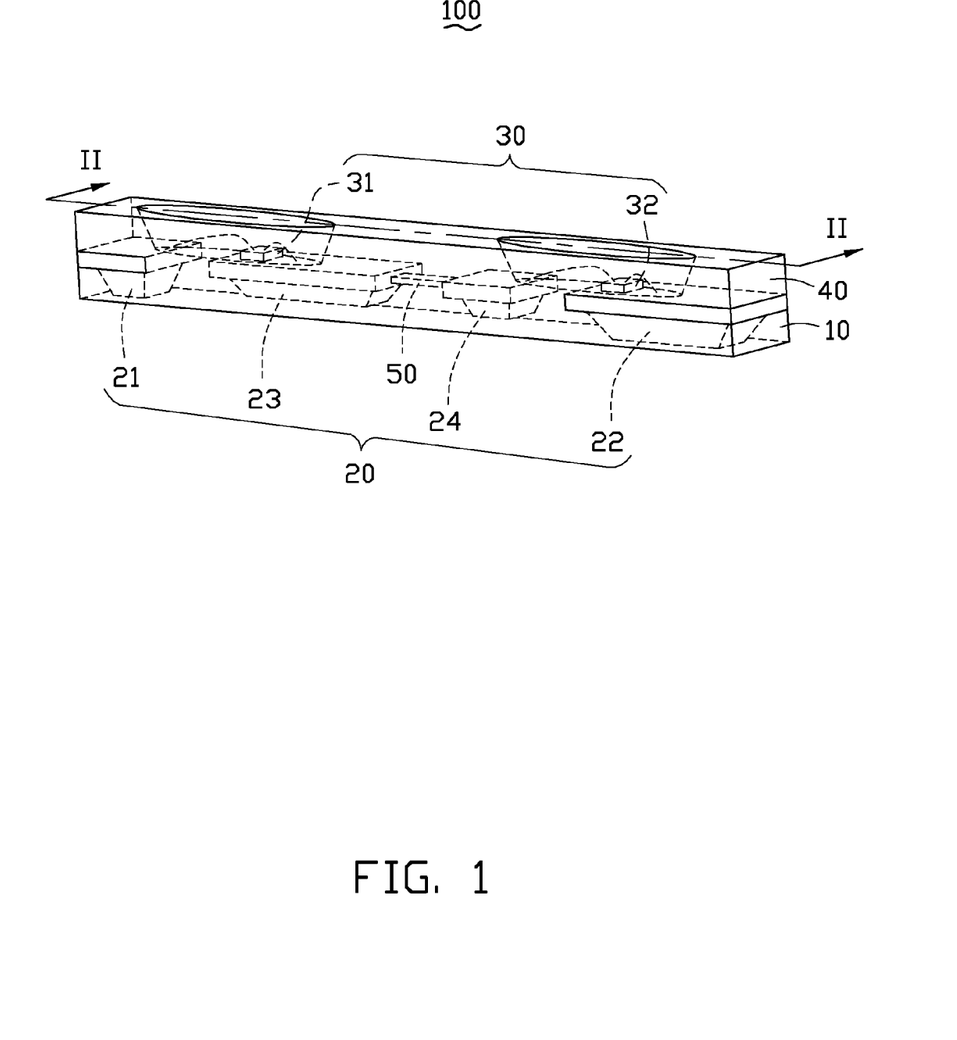
FIG. 1 is a perspective view of an LED package in accordance with a first exemplary embodiment of the present disclosure.
Figure 2:
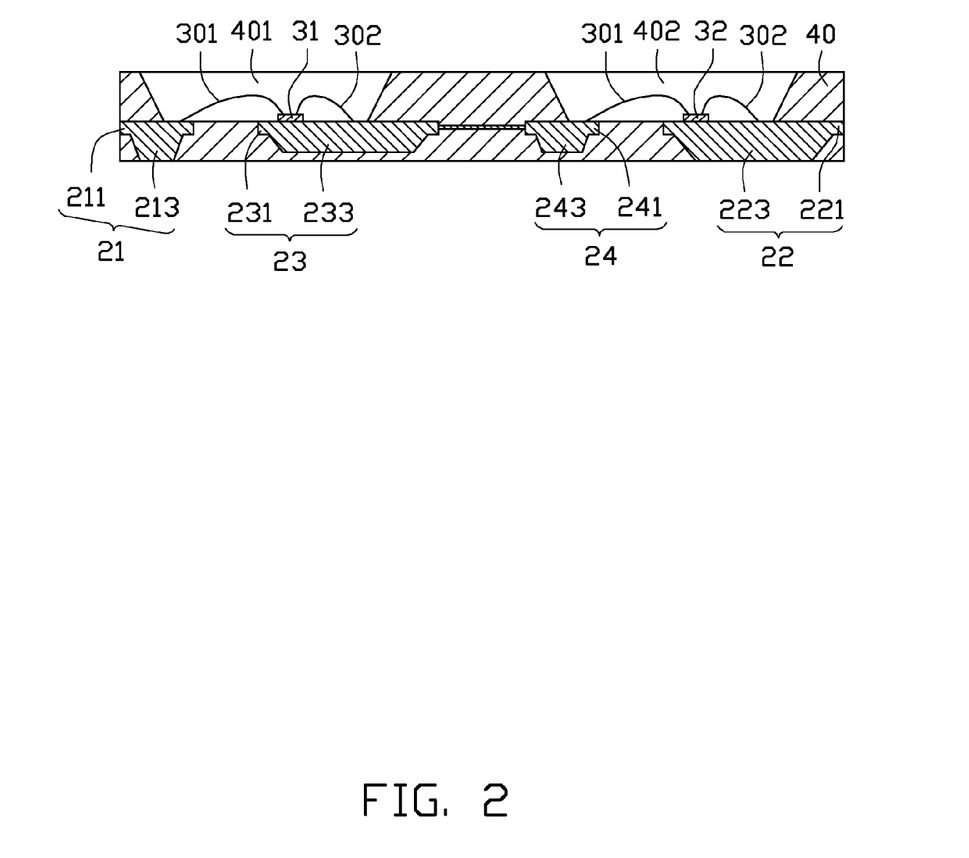
FIG. 2 is a cross-sectional view of the LED package of FIG. 1, taken along line II-II thereof.

Referring to FIGS. 1 and 2, an LED package 100, in accordance with an exemplary embodiment, is provided. The LED package 100 includes a substrate 10, an electrode structure 20 embedded in the substrate 10, a plurality of LED chips 30 electrically connecting with the electrode structure 20, and a reflector 40 located on the substrate 10 and covering the electrode structure 20 and surrounding the LED chips 30.

The substrate 10 is made of electrically insulating material, such as epoxy resin. In this embodiment, the substrate 10 is a rectangular parallelepiped board.

The electrode structure 20 includes a first electrode 21, a second electrode 22, a third electrode 23 and a fourth electrode 24. The first electrode 21, the second electrode 22, the third electrode 23, and the fourth electrode 24 are spaced from each other, and are arranged along a longitudinal direction of the LED package 100. The first electrode 21 and the second electrode 22 are located at opposite ends of the substrate 10 along the longitudinal direction. The third electrode 23 and the fourth electrode 24 are successively located between the first electrode 21 and the second electrode 22. In this embodiment, the third electrode 23 and the fourth electrode 24 electrically connect with each other via a connecting bar 50.

Top surfaces of the first, second, third and fourth electrodes 21, 22, 23, 24 are exposed out of a top surface of the substrate 10 to support the LED chips 30. In this embodiment, the top surfaces of the first, second, third and fourth electrodes 21, 22, 23, 24 are coplanar with each other, and are coplanar with the top surface of the substrate 10.

Front side faces of the first and second electrode 21, 22 are exposed out of the front side face of the substrate 10, and rear side faces of the first and second electrodes 21, 22 are exposed out of the corresponding rear side face of the substrate 10. The exposed front and rear side faces of the first and second electrodes 21, 22 are used to connect with corresponding welding pads on a printed circuit board (not shown). In this embodiment, bottom surfaces of the first and second electrodes 21, 22 are exposed out of the bottom surface of the substrate 10, and are coplanar with the bottom surface of the substrate 10. Alternatively, the bottom surfaces of the first and second electrodes 21, 22 can be received in the substrate 10.

The circumferential side faces of the third electrode 23 are received in the substrate 10. The circumferential side faces of the fourth electrode 24 are received in the substrate 10. Bottom surfaces of the third and fourth electrodes 23, 24 are coplanar with each other. In this embodiment, the bottom surfaces of the third and fourth electrodes are located above the bottom surfaces of the first and second electrodes 21, 22, and are received in the substrate 10. Alternatively, the bottom surfaces of the third and fourth electrodes 23, 24 can be exposed out of the bottom surface of the substrate 10.

The first electrode 21 includes a first main portion 211 and a first supporting portion 213 extending downwardly from a central portion of a bottom surface of the first main portion 211, such that a cross-sectional view of the first electrode 21 has an approximately T-shaped configuration. The first main portion 211 is a rectangular board. The first supporting portion 213 has a configuration like an inverted quadrangular frustum, and a size of the first supporting portion 213 is gradually decreased from a top end connecting with the bottom surface of the first main portion 211 to the bottom end thereof which is away from first main portion 211. A top surface of the first main portion 211 is the top surface of the first electrode 21. A bottom surface of the first supporting portion 213 is the bottom surface of the first electrode 21.

The second electrode 22 has a structure similar to the structure of the first electrode 21, and the second electrode 22 includes a second main portion 221 and a second supporting portion 223. The top surface of the second main portion 221 is the top surface of the second electrode 22, and the bottom surface of the supporting portion 223 is the bottom surface of the second electrode 22.

Similarly, the third electrode 23 includes a third main portion 231 and a third supporting portion 233; and the fourth electrode 24 includes a fourth main portion 241 and a fourth supporting portion 243. The top surfaces of the third and the fourth main portions 231, 241 are the top surfaces of the third and fourth electrodes 23, 24 respectively, and the bottom surfaces of the third and fourth supporting portion 233, 243 are the bottom surfaces of the third and fourth electrodes 23, 24.

The LED chips 30 include a first LED chip 31 and a second LED chip 32. In this embodiment, the first LED chip 31 is located on the top surface of the third main portion 231, and electrically connects with the first and third electrodes 21, 23 respectively via wires 301, 302. The second LED chip 32 is located on the top surface of the second main portion 221, and electrically connects with the fourth and second electrodes 24, 22 respectively via wires 301, 302. The first LED chip 31 and the second LED chip 32 can radiate light with different colors. Alternatively, the first LED chip 31 can be mounted on the top surface of the first electrode 21, the second LED chip 32 can be mounted on the top surface of the third electrode 23; and the first and second LED chips 31, 32 can radiate light with a same color.

The reflector 40 defines a first through hole 401 and a second through hole 402 therein. The first LED chip 31 is located at the bottom of the first through hole 401. The second LED chip 32 is located at the bottom of the second through hole 402. The first LED chip 31 and the second LED chip 32 are surrounded by the reflector 40.

The connecting bar 50 is received in the substrate 10, and is located between the third electrode 23 and the fourth electrode 24. In this embodiment, the connecting bar 50 is made of copper.

Figure 3:
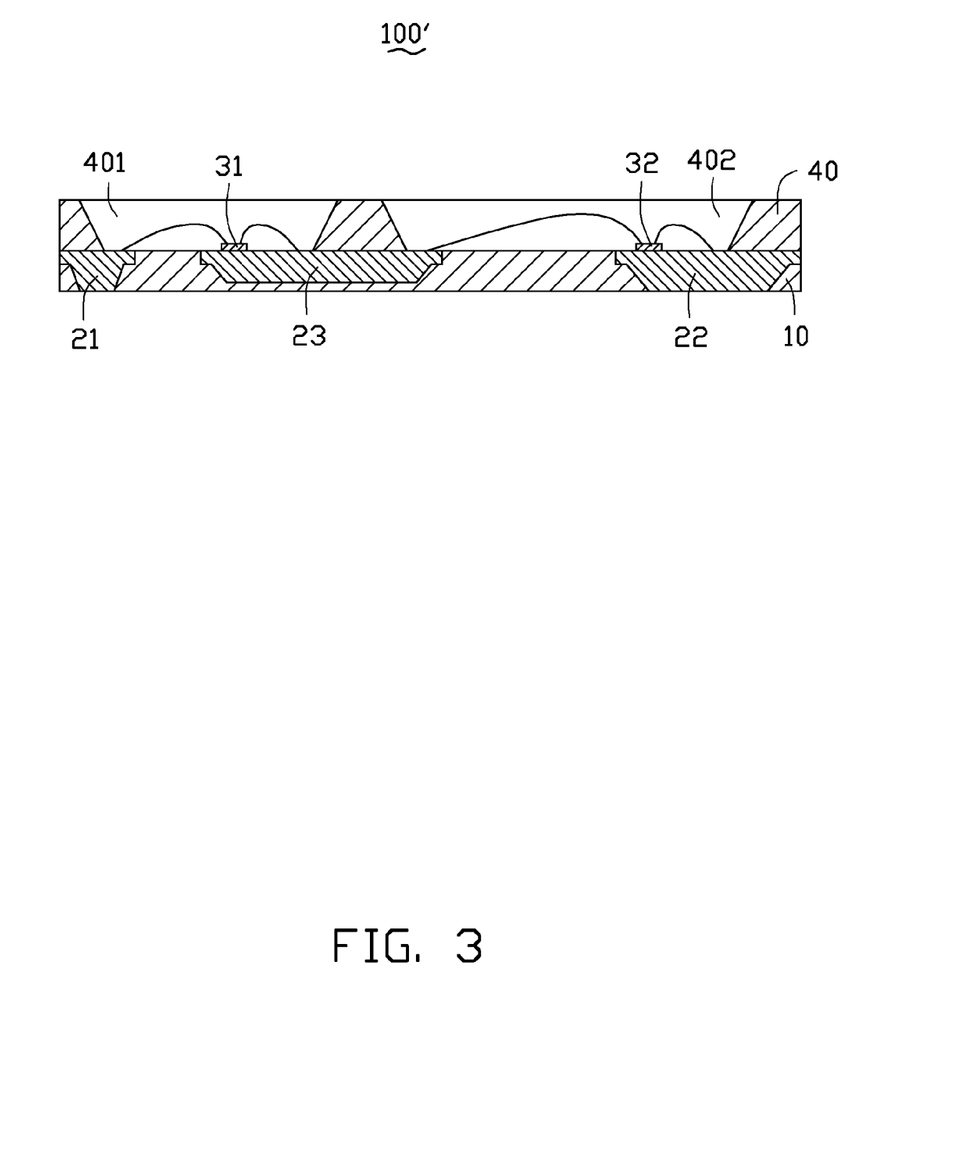
FIG. 3 shows a cross-sectional view of another LED package in accordance with a second exemplary embodiment of the present disclosure.

Referring to FIG. 3, the difference between the second embodiment and the first embodiment is that the second embodiment does not have the fourth electrode 24 and the connecting bar 50 of the first embodiment.

And in the second embodiment, top surfaces of the first, second and third electrodes 21, 22, 23 are exposed out of the top surface of the substrate 10 to support LED chips 30. Front side faces of the first and second electrode 21, 22 are exposed out of the front side face of the substrate 10, rear side faces of the first and second electrodes 21, 22 are exposed out of the rear side face of the substrate 10. The circumferential side faces of the third electrode 23 are received in the substrate 10. In this embodiment, the bottom surfaces of the first and second electrodes 21, 22 are exposed out of the bottom surfaces of the substrate 10, the bottom surface of the third electrode 23 is received in the substrate 10.

The first LED chip 31 is located on the top surface of the third electrode 23 exposed at the bottom of the first through hole 401, and electrically connects with the first and third electrodes 21, 23 via wires 301, 302 respectively. The second LED chip 32 is located on the top surface of the second electrode 22 exposed at the bottom of the second through hole 402, and electrically connects with the second and third electrodes 22, 23 via wires 301, 302 respectively.

According to the LED package 100, 100', because the first electrode 21 and the second electrode 22 are widely separated by the substrate 10 and at least a third electrode 23, the welding pads on a circuit corresponding to the exposed front side faces or rear side faces of the first and second electrodes 21, 22 are widely separated, which decreases the risk of overflow of molten solder of solder pads corresponding to the first and second electrodes 21, 22 from one of the first and second electrodes 21, 22 to the other to contaminate each other; such contamination may cause the LED package 100 (100') to have a short-circuit. Thus, the reliability and quality of the LED package 100, 100' are improved.

The present disclosure further provides a method for manufacturing the LED package. The method includes following steps.

Figure 4:
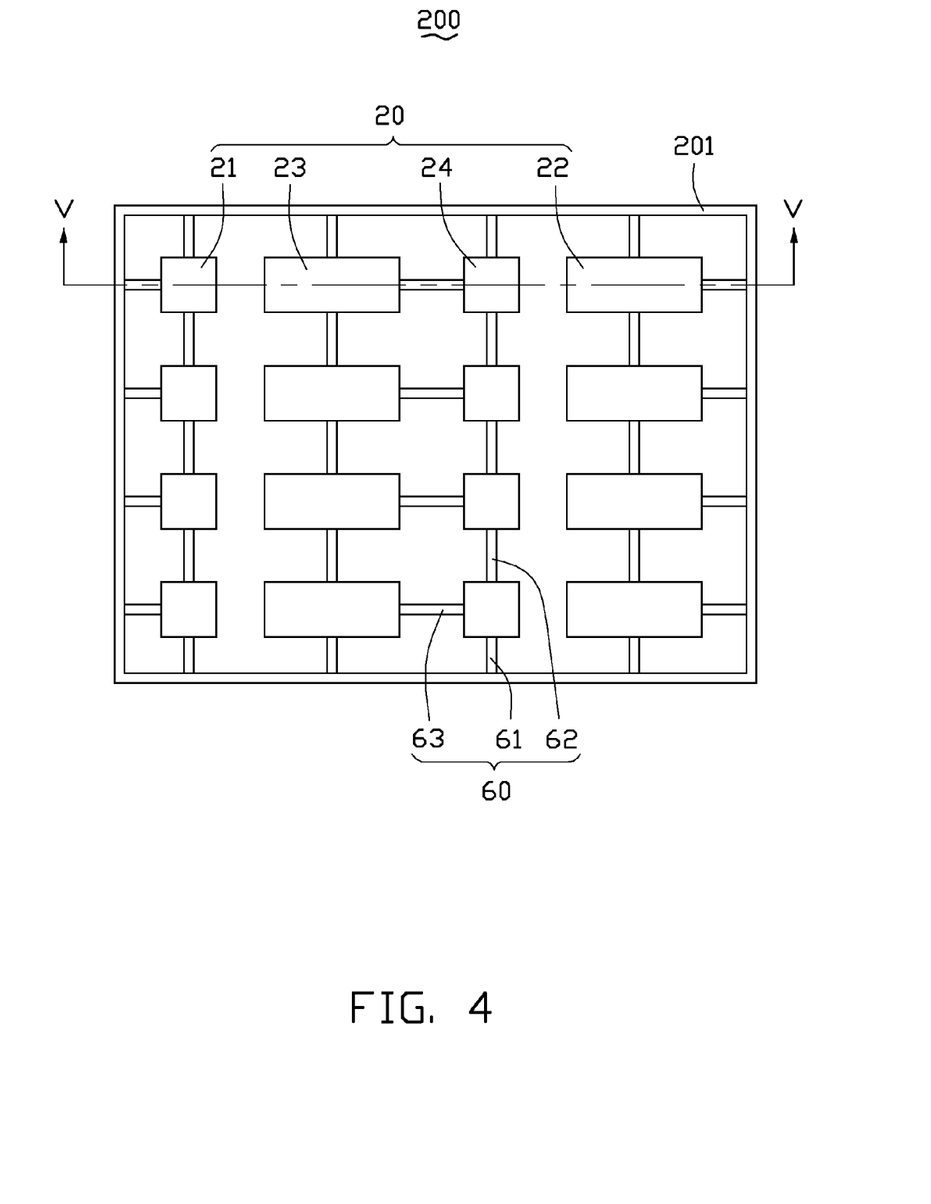
FIGS. 4-9 are schematic views showing steps of a method for manufacturing an LED package of the present disclosure.
Figure 5:
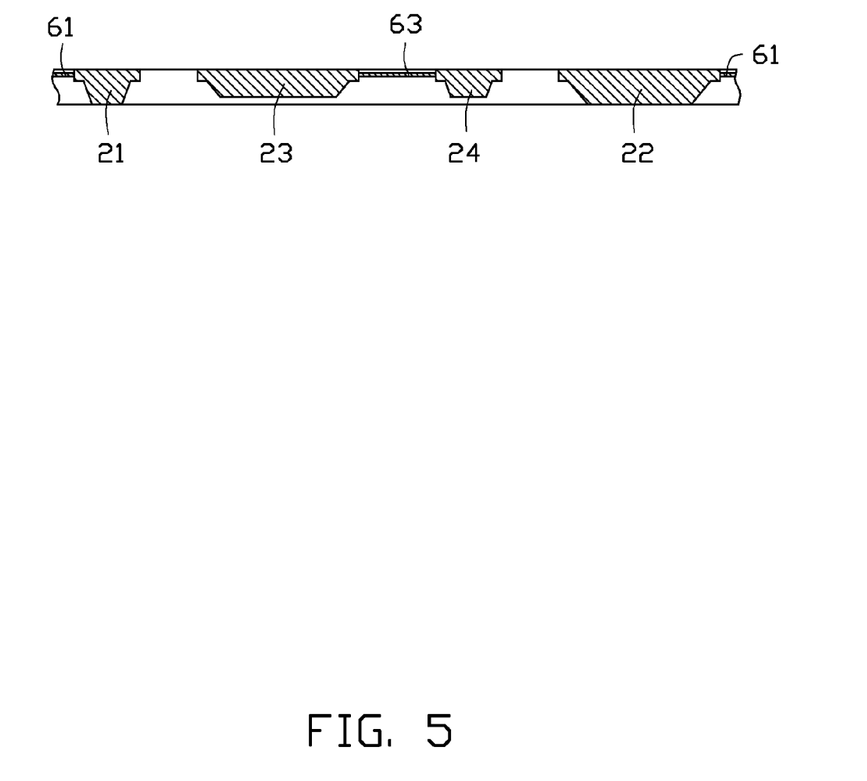

Referring to FIGS. 4-5, the first step is to provide an engaging frame 200. The engaging frame 200 includes a rectangular lead frame 201, a plurality of electrode structures 20 enclosed by the lead frame 201, and a bracket 60 connecting the electrode structures 20 to the lead frame 201. The lead frame 201 is made of metallic material, such as copper.

In this embodiment, the number of the electrode structures 20 is four. The four electrode structures 20 are arranged in four rows along a top-to-bottom direction of the lead frame 201. The first, second, third and fourth electrodes 21, 22, 23, 24 of the electrode structure 20 are spaced from each other, and are arranged along the longitudinal (left-to-right) direction of the lead frame 201. The third and the fourth electrodes 23, 24 are successively located between the first and second electrode 21, 22.

The bracket 60 includes a plurality of first brackets 61, a plurality of second brackets 62 and a plurality of third brackets 63. The first brackets 61 connect the outer sides of the electrodes 21, 22, 23, 24 facing towards the lead frame 201 to the corresponding inner surfaces of the lead frame 201. Two adjacent first electrodes 21, two adjacent second electrodes 22, two adjacent third electrodes 23 and two adjacent fourth electrodes 24 are respectively connected together by the second brackets 62. The third electrode 23 and the fourth electrode 24 of each electrode structure 20 are connected together by a corresponding third bracket 63.

Figure 6:
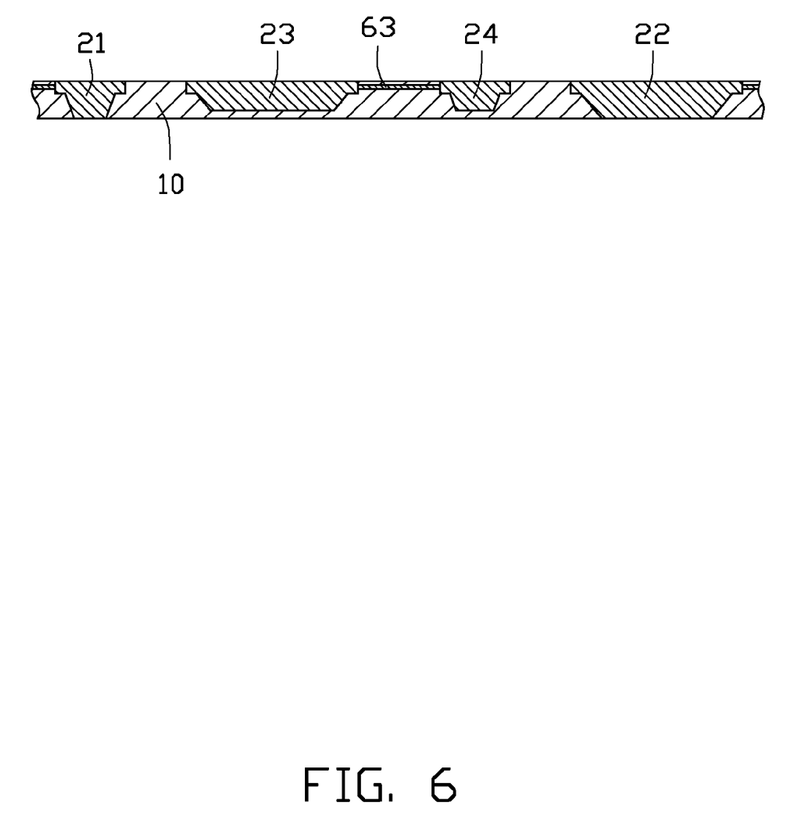

Referring to FIG. 6, the second step is to form a substrate 10 receiving the electrode structures 20 therein. In this embodiment, the substrate 10 is formed by molding of plastic material. The top surfaces of the first, second, third and fourth electrodes 21, 22, 23, 24 are exposed out of the top surface of the substrate 10. Front side faces of the first and second electrodes 21, 22 are exposed out of the substrate 10, and rear side faces of the first and second electrodes 21, 22 are exposed out of the substrate 10. Circumferential side faces of the third and fourth electrodes 23, 24 are received in the substrate 10.

Figure 7:
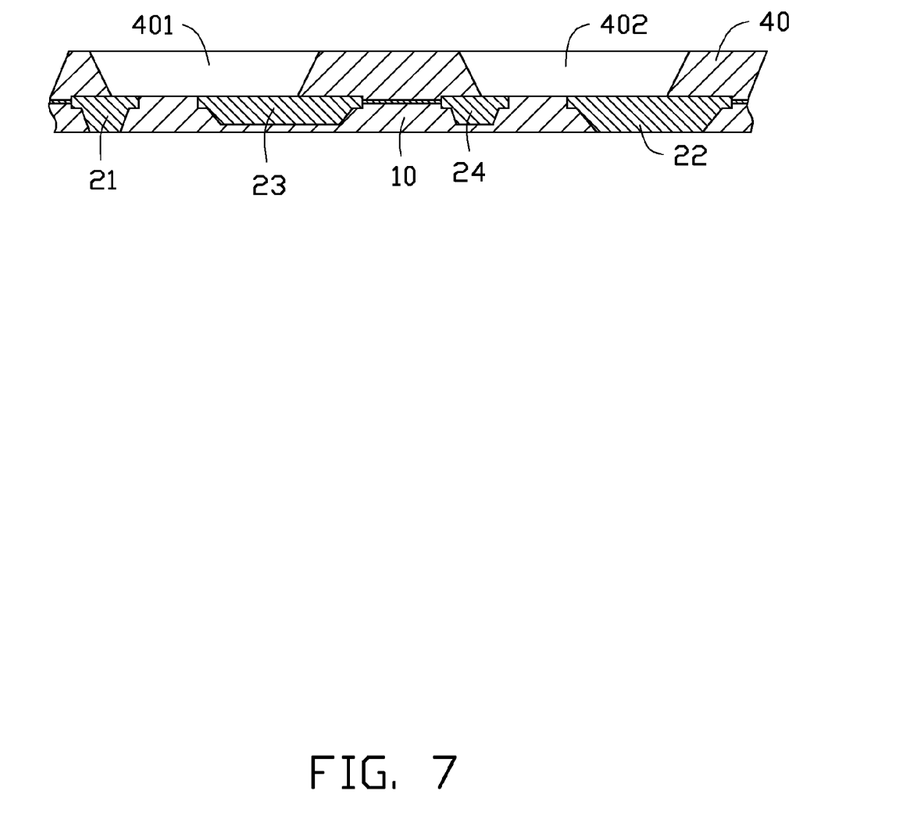

Referring to FIG. 7, the third step is to form a reflector 40 on the substrate 10 to cover the electrode structures 20. In this embodiment, each first through hole 401 is corresponding with the first and third electrodes 21, 23. A part of the top surface of the first electrode 21 is exposed at the bottom end of the first through hole 401, and a part of the top surface of the third electrode 23 is exposed at the bottom end of the first through hole 401 as well to support the first LED chip 31.

Similarly, each second through hole 402 is corresponding to the second and fourth electrode 22, 24 of a corresponding electrode structure 20. A part of the top surface of the second electrode 22 is exposed at the bottom end of the second through hole 402; and a part of the top surface of the fourth electrode 24 is exposed at the bottom end of the second through hole 402 as well to support the second LED chip 32.

Figure 8:
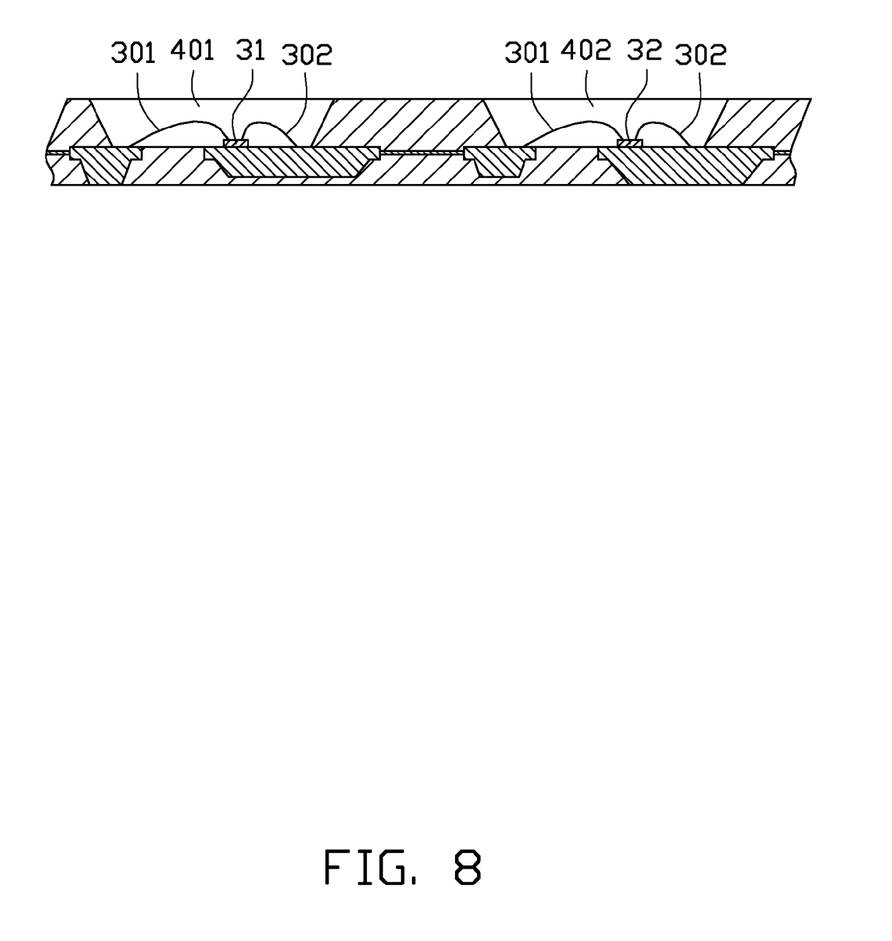

Referring to FIG. 8, the fourth step is to provide the first LED chip 31 and the second LED chip 32, and mount the first and second LED chips 31, 32 at bottoms of the through holes 401, 402 correspondingly to electrically connect with the electrodes 21, 22, 23, 24 respectively. The first LED chip 31 is mounted on the top surface of the third electrode 23 and electrically connected to the first and third electrodes 21, 23 via the wires 301, 302. The second LED chip 32 is mounted on the top surface of the second electrode 22 and electrically connected to the second and fourth electrodes 22, 24 via the wires 301, 302.

Figure 9:
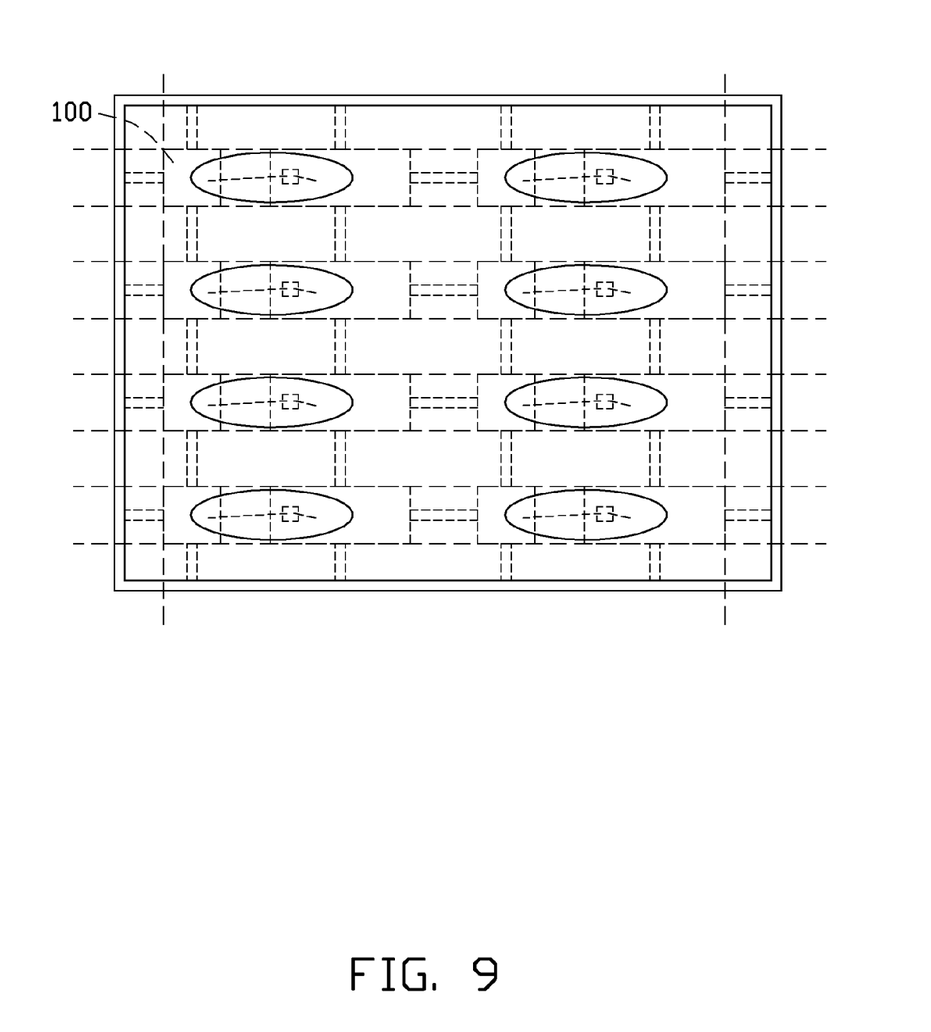

Referring to FIG. 9, the fifth step is to cut the engaging frame 200 and the substrate 10 to obtain a plurality of individual LED packages 100. In this embodiment, the cutting of the engaging frame 200 and the substrate 10 is performed along the dashed lines shown in FIG. 9 to form the LED packages 100 each being shown in FIGS. 1 and 2.

Alternatively, between the fourth step and the fifth step, phosphor-containing encapsulants can be injected in the through holes 401, 402 to respectively encapsulate the first and second LED chips 31, 32.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A light emitting diode (LED) package comprising:
an electrically insulating substrate;
an electrode structure embedded in the insulating substrate, the electrode structure comprising a first electrode, a second electrode and a third electrode spaced from each other; and
a plurality of LED chips electrically connecting with the electrode structure, the third electrode being located between the first and second electrodes, top surfaces of the first, second and third electrodes being exposed out of a top surface of the insulating substrate to support the LED chips, front side faces of the first and second electrodes being exposed out of the front side face of the substrate, circumferential side faces of the third electrode being encapsulated in the substrate.

2. The LED package of claim 1, wherein rear side faces of the first and second electrodes are also exposed out of the corresponding rear side face of the substrate.

3. The LED package of claim 2, wherein bottom surfaces of the first and second electrodes are exposed out of the bottom surface of the substrate, and bottom surface of the third electrode is encapsulated in the substrate.

4. The LED package of claim 3, wherein top surfaces of the first, second and third electrodes are coplanar with the top surface of the substrate, and bottom surfaces of the first and second electrodes are coplanar with the bottom surface of the substrate.

5. The LED package of claim 1, wherein the LED chips comprises a first LED chip and a second LED chip, the first LED chip electrically connects the first and third electrode respectively, and the second LED chip electrically connects the second and the third electrodes respectively.

6. The LED package of claim 1, wherein the electrode structure further comprises a fourth electrode located between the third and second electrodes, the fourth electrode connects with the third electrode via a connecting bar.

7. The LED package of claim 6, wherein top surface of the fourth electrode are exposed out of the top surface of the substrate to support LED chips, circumferential side faces of the fourth electrode are encapsulated in the substrate.

8. The LED package of claim 7, wherein bottom surfaces of the third and fourth electrodes are encapsulated in the substrate.

9. The LED package of claim 8, wherein top surfaces of the first, second, third and fourth electrodes are coplanar with the top surface of the substrate.

10. The LED package of claim 7, wherein the LED chips comprises a first LED chip and a second LED chip, the first LED chip is mounted on the top surface of the third electrode, and electrically connects the first and third electrodes respectively, the second LED chip is mounted on the top surface of the second electrode, and electrically connects the second and fourth electrodes respectively.

11. The LED package of claim 5, wherein a reflector is located on the substrate, the reflector defines a first through hole and a second through hole spaced from the first through hole, the first LED chips is located at the bottom of the first through hole, and the second LED chips is located at the bottom of the second through hole.

12. The LED package of claim 10, wherein a reflector is located on the substrate, the reflector defines a first through hole and a second through hole spaced from the first through hole, the first LED chips is located at the bottom of the first through hole, and the second LED chips is located at the bottom of the second through hole.

* * * * *